(12) United States Patent
Inoue

(10) Patent No.: US 6,995,497 B2
(45) Date of Patent: Feb. 7, 2006

(54) FILM BULK ACOUSTIC RESONATOR

(75) Inventor: Kenji Inoue, Tokyo (JP)

(73) Assignee: TDK Corporation, (JP)

( * ) Notice: Subject to any disclaimer, the term of this patent is extended or adjusted under 35 U.S.C. 154(b) by 142 days.

(21) Appl. No.: 10/776,743

(22) Filed: Feb. 11, 2004

(65) Prior Publication Data

US 2005/0093399 A1    May 5, 2005

(30) Foreign Application Priority Data

Oct. 29, 2003  (JP)  ............................. 2003-368295

(51) Int. Cl.
*H01L 41/08*    (2006.01)
(52) U.S. Cl. ...................... 310/320; 310/326
(58) Field of Classification Search ................ 310/320, 310/326, 311
See application file for complete search history.

(56) References Cited

U.S. PATENT DOCUMENTS

| | | | |
|---|---|---|---|
| 5,872,493 A | 2/1999 | Ella | ............................ 333/191 |
| 5,936,150 A * | 8/1999 | Kobrin et al. | ............. 73/24.06 |
| 6,339,276 B1 * | 1/2002 | Barber et al. | ................ 310/312 |
| 6,452,310 B1 * | 9/2002 | Panasik | ...................... 310/334 |
| 6,603,241 B1 * | 8/2003 | Barber et al. | ............... 310/335 |
| 6,720,844 B1 * | 4/2004 | Lakin | ......................... 333/189 |
| 2002/0185936 A1 * | 12/2002 | Barber et al. | ............... 310/328 |

* cited by examiner

*Primary Examiner*—Thomas M. Dougherty
(74) *Attorney, Agent, or Firm*—Young Law Firm, P.C.

(57) ABSTRACT

A film bulk acoustic resonator of the present invention includes an upper electrode 104, a lower electrode 102, and a piezoelectric film 103 as well as an acoustic multilayer 120 that are provided between the upper electrode 104 and the lower electrode 102. Thus, a distance between the upper electrode 104 and the lower electrode 102 is extended by a thickness of the acoustic multilayer 120, and electrostatic capacitance between the upper electrode 104 and the lower electrode 102 per unit area can be reduced accordingly. Therefore, an electrode area can be increased as compared to when there is no acoustic multilayer 120, and an influence of grains of a piezoelectric material can be reduced.

14 Claims, 3 Drawing Sheets

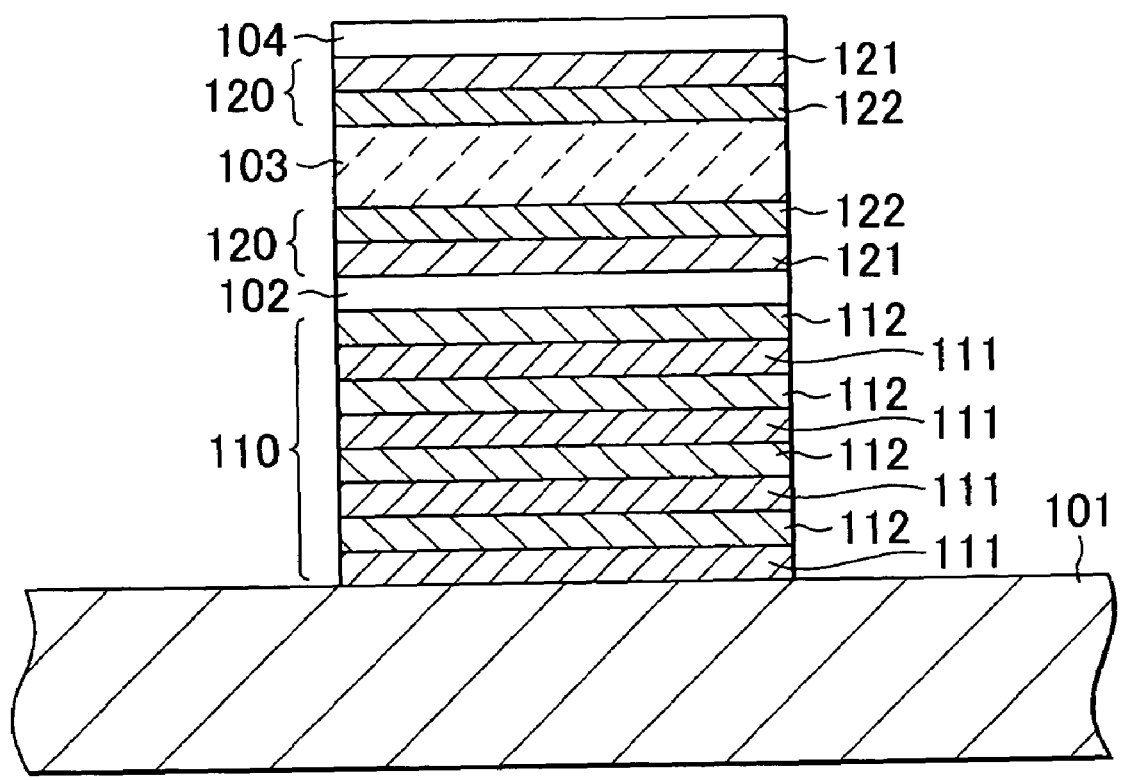

FILM BULK ACOUSTIC RESONATOR

TECHNICAL FIELD

The present invention relates to a film bulk acoustic resonator, and particularly, to a film bulk acoustic resonator having a high resonant frequency.

BACKGROUND OF THE INVENTION

In recent years, various resonators using piezoelectric materials such as a film bulk acoustic resonator (FBAR) and a surface acoustic wave (SAW) resonator have come into practical use as small and high-performance resonators. Especially, the film bulk acoustic resonator has been recently attracting attention in view of uses where a high resonant frequency such as 5 GHz or more is required, because the resonant frequency thereof is easily increased due to its structure compared to the surface acoustic wave resonator.

As described in U.S. Pat. No. 5,872,493, the film bulk acoustic resonator is basically constituted of an upper electrode, a lower electrode and a piezoelectric film interposed therebetween. A certain resonance characteristics can be obtained by applying a high frequency signal between the upper electrode and the lower electrode. The resonant frequency of the film bulk acoustic resonator mainly depends on film thicknesses of the upper electrode, the lower electrode and the piezoelectric film. These film thicknesses are set by referring to a wavelength determined by a ratio of an acoustic velocity of a bulk wave to the resonant frequency (acoustic velocity/resonant frequency). Here, the acoustic velocity of the bulk wave is determined by physical properties (elastic constant and the like) of materials of films. Therefore, the wavelength in each film decreases with increasing the resonant frequency. In other words, in order to obtain a higher resonant frequency, it is necessary to decrease the film thicknesses of the piezoelectric film and electrodes.

Therefore, when a high resonant frequency such as 5 GHz or more is required, the film thickness of the piezoelectric film needs to be set extremely thin. For example, when zinc oxide (ZnO) is used as a material for the piezoelectric film, the film thickness thereof needs to be set at approximately 0.27 $\mu$m in order to obtain the resonant frequency of 5 GHz or more. When the film thickness of the piezoelectric film is made thinner, the distance between the upper and lower electrodes naturally becomes short. Electrostatic capacitance between the upper and lower electrodes is increased accordingly.

Meanwhile, when a filter is configured by using a plurality of film bulk acoustic resonators, the filter characteristics greatly depend on a capacitance ratio of electrostatic capacitance of a parallel arm resonator to electrostatic capacitance of a series arm resonator (Cp/Cs) and a capacitance product (Cp·Cs). Here, "Cp" means electrostatic capacitance of a parallel arm resonator and "Cs" means electrostatic capacitance of a series arm resonator. For example, input/output impedance of the filter depends on the capacitance product (Cp·Cs), and to make the capacitance product to be 50 $\Omega$, values of Cp and Cs need to be adjusted to satisfy the following equation:

$$Cp \cdot Cs = \frac{1}{(2\pi f_0 \cdot 50)^2} \quad (1)$$

where, $f_0$ is the resonant frequency. Referring to the equation (1), it is obvious that the optimum capacitance product (Cp·Cs) decreases with increasing the resonant frequency $f_0$.

However, as described above, in order to make the resonant frequency higher in the film bulk acoustic resonator, the film thickness of the piezoelectric film needs to be set thin. Therefore, in contrast to the above, the electrostatic capacitance per unit area increases with increasing the resonant frequency. Hence, in order to obtain a high resonant frequency while maintaining the input/output impedance at 50 $\Omega$, overlap between the upper and lower electrodes (electrode area) needs to be set small. For example, when zinc oxide (ZnO) is used as a material for the piezoelectric film to set the resonant frequency to be 5 GHz or more, it is required to reduce the electrode area to approximately 5000 $\mu$m$^2$ or less.

However, the piezoelectric film used for the film bulk acoustic resonator is not composed of a single crystal piezoelectric material but of c-axis oriented grains of finite sizes, and therefore if the electrode area is set extremely small, an influence of the c-axis oriented grains cannot be ignored. Thus, there has been a problem that the resonance characteristics are degraded. This kind of problem becomes markedly when the electrode area is approximately 5000 $\mu$m$^2$ or less. Therefore, it has hitherto been difficult to obtain a resonant frequency of 5 GHz or more while the degradation in the resonance characteristics is reduced.

SUMMARY OF THE INVENTION

Therefore, an object of the present invention is to provide a film bulk acoustic resonator capable of obtaining a high resonant frequency while reducing degradation in resonance characteristics.

The film bulk acoustic resonator according to the present invention includes an upper electrode, a lower electrode, a piezoelectric film and an acoustic multilayer provided between the upper and lower electrodes. According to the present invention, not only the piezoelectric film but also the acoustic multilayer is interposed between the upper and lower electrodes. A distance between the upper and lower electrodes is accordingly extended by the thickness of the acoustic multilayer, and electrostatic capacitance between the upper and lower electrodes per unit area can be reduced. Hence, an electrode area can be increased as compared to when there is no acoustic multilayer, and an influence of grains of a piezoelectric material can be reduced.

In the present invention, the acoustic multilayer preferably includes at least one pair of a first reflective film and a second reflective film composed of a material different from that of the first reflective film. It is preferable that a main component of the first reflective film is aluminum nitride (AlN) and a main component of the second reflective film is silicon oxide (SiO$_2$). The second reflective film is preferably located at the piezoelectric film side in view of the first reflective film. Here, the 'main component' may contain a minute amount of another material and impurities which are inevitably mixed with. Moreover, the film bulk acoustic resonator of the present invention can further includes another acoustic multilayer provided between the lower electrode and a substrate.

Thus, according to the present invention, the electrode area can be increased as compared to that of a conventional film bulk acoustic resonator in which the acoustic multilayer between the upper and lower electrodes is not provided. It is therefore possible to obtain a high resonant frequency while reducing the degradation in the resonance characteristics. Hence, this invention is effective especially when a high resonant frequency such as 5 GHz or more is required.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 5 is a schematic sectional view showing a structure of a film bulk acoustic resonator according to still another preferred embodiment of the present invention.

DETAILED DESCRIPTION OF THE EMBODIMENTS

Preferred embodiments of the present invention will now be explained in detail with reference to the drawings.

Figure 1:
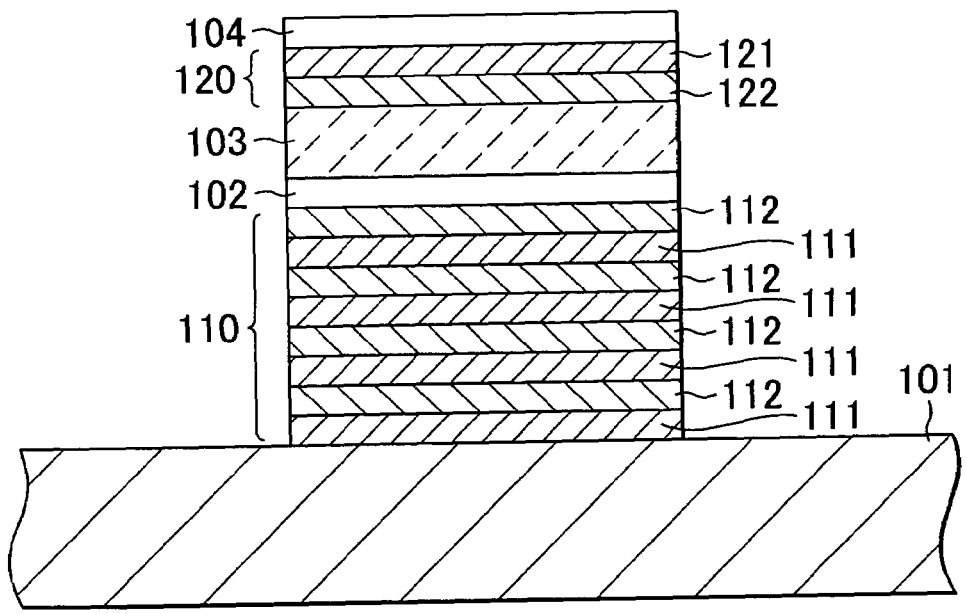
FIG. 1 is a schematic sectional view showing a structure of a film bulk acoustic resonator according to a preferred embodiment of the present invention.

FIG. 1 is a schematic sectional view showing a structure of a film bulk acoustic resonator according to a preferred embodiment of the present invention.

As shown in FIG. 1, the film bulk acoustic resonator according to this embodiment is constituted of a substrate 101, an acoustic multilayer 110 provided on the substrate 101, a lower electrode 102 provided on the acoustic multilayer 110, a piezoelectric film 103 provided on the lower electrode 102, an acoustic multilayer 120 provided on the piezoelectric film 103, and an upper electrode 104 provided on the acoustic multilayer 120. A certain resonance characteristics can be obtained by applying a high frequency signal between the lower electrode 102 and the upper electrode 104.

The substrate 101 serves as a substrate for securing mechanical strength of the film bulk acoustic resonator. A single crystal substrate of silicon (Si), sapphire or the like, a ceramic substrate of alumina, AlTiC or the like, or a quartz or glass substrate can be used as a material for the substrate 101. The most preferable material for the substrate 101 is Si single crystal, which is advantageous from the points of low cost and the availability of sophisticated wafer processes.

The acoustic multilayer 22 is constituted of alternately stacked reflective films 111 and 112 made of different material from each other. The acoustic multilayer 22 enhance the characteristics of the film bulk acoustic resonator by reflecting vibration propagating toward the substrate 101. The number of the reflective films constituting the acoustic multilayer 110 is not particularly limited. However, in this embodiment, four pairs of the reflective films 111 and 112 are stacked. Materials for the reflective films 111 and 112 are not particularly limited as long as acoustic impedance of the reflective film 111 is higher than that of the reflective film 112. However, among the reflective films 111 and 112 making up the pair, it is preferable that aluminum nitride (AlN) is used for the reflective film 111 located at the substrate 101 side and silicon oxide ($SiO_2$) for the reflective film 112 located at the lower electrode 102 side. When made of aluminum nitride (AlN), the reflective films 111 are preferably formed by sputtering. When made of silicon oxide ($SiO_2$), the reflective films 112 are preferably formed by chemical vapor deposition (CVD). The thicknesses of the reflective films 111 and 112 may be set in accordance with the desired resonance frequency, and each thickness is preferably set at approximately a quarter of a wavelength. Here, the wavelength can be defined, as described above, by the ratio of the acoustic velocity of the bulk acoustic wave to the desired resonant frequency (acoustic velocity/resonant frequency).

The lower electrode 102 is used as one of the electrodes of the film bulk acoustic resonator and as a film underlying the piezoelectric film 103 during manufacturing. When a piezoelectric material of wurtzite crystal structure such as aluminum nitride (AlN), zinc oxide (ZnO) or gallium nitride (GaN) is used as the material of the piezoelectric film 103, the lower electrode 102 is preferably a metallic film uniaxially oriented in the (111) plane of a face-centered cubic structure or the (0001) plane of a hexagonal close-packed structure. When a metallic film that is uniaxially oriented in the (111) plane of a face-centered cubic structure or a metallic film that is uniaxially oriented in the (0001) plane of a close-packed hexagonal structure is used as the lower electrode 102, crystallinity of the piezoelectric material formed on the lower electrode 102 becomes extremely good through epitaxial growth.

The material of the lower electrode 102 preferably contains as its main component at least one of platinum (Pt), gold (Au), iridium (Ir), osmium (Os), rhenium (Re), palladium (Pd), rhodium (Rh) and ruthenium (Ru). Platinum (Pt), gold (Au), iridium (Ir), palladium (Pd) and rhodium (Rh) assume a face-centered cubic structure and osmium (Os), rhenium (Re) and ruthenium (Ru) assume a hexagonal close-packed structure. The surfaces of these metals are easy to keep clean and when fouled can be readily cleaned by ashing or heat treatment. A clean surface of the lower electrode 102 facilitates the formation of the piezoelectric film 103 with good crystallinity.

The lower electrode 102 is not limited to the foregoing metals, however, and can instead be formed of, for example, a film of body-centered cubic structure metal such as molybdenum (Mo) or tungsten (W) or a film of a perovskite structure oxide conductor such as $SrRuO_3$.

The thickness of the lower electrode 102 may be set in accordance with the desired resonant frequency, and preferably set at approximately 1/10 of the wavelength. The lower electrode 102 is preferably formed by vacuum deposition, sputtering or CVD.

Note that it is also preferable to interpose an adhesion layer between the lower electrode 102 and the acoustic multilayer 110 to improve adhesion therebetween. The adhesion layer is preferably constituted of a crystal having a wurtzite crystal structure. The material thereof is preferably a nitrogen compound of at least one element selected from among Group III elements such as aluminum (Al), gallium (Ga) and indium (In), or an oxide or sulfide of a Group II element such as beryllium (Be) or zinc (Zn). AlN is the most preferable material for the adhesion layer because it is stable in the atmosphere and can be easily formed into a film of high crystallinity by reactive sputtering.

The piezoelectric film 103 serves to convert an electric signal applied between the lower electrode 102 and the upper electrode 104 into a bulk acoustic wave. As explained earlier, the piezoelectric material having the wurtzite crystal structure such as aluminum nitride (AlN) zinc oxide (ZnO), gallium nitride (GaN) or the like can be used as a material for the piezoelectric film 103. The piezoelectric film 103 is not composed of a single crystal piezoelectric material but of c-axis oriented grains having finite sizes. Therefore, if overlap between the upper electrode 104 and the lower electrode 102 (electrode area) is reduced, an influence of the grains becomes relatively large. In particular, when the electrode area becomes approximately 5000 $\mu$m$^2$ or less, the influence of the grains cannot be ignored. Resonance characteristics of the film bulk acoustic resonator are greatly degraded accordingly.

The thickness of the piezoelectric film 103 may be set in accordance with the desired resonant frequency, and preferably set at approximately half of the wavelength. In addition, to form the piezoelectric film 103, it is preferable that the material for the piezoelectric film 103 is epitaxially grown by vacuum deposition, sputtering or CVD.

The acoustic multilayer 120 is made up of a pair of the reflective film 121 (first reflective film) and the reflective film 122 (second reflective film) which are composed of different materials. In this embodiment, the acoustic multilayer 120 is interposed between the piezoelectric film 103 and the upper electrode 104. The acoustic multilayer 120 serves to extend a distance between the lower electrode 102 and the upper electrode 104 while reducing degradation in the resonance characteristics. In other words, by providing the acoustic multilayer 120, electrostatic capacitance between the lower electrode 102 and the upper electrode 104 per unit area is reduced. Therefore, the overlap between the upper and lower electrodes (electrode area) can be increased as compared to when there is no acoustic multilayer 120.

The reason why the acoustic multilayer 120 is used to extend the distance between the lower electrode 102 and the upper electrode 104 is in order to reduce leak of vibration energy. In other words, when only a single layer insulating film made of SiO$_2$ or the like is interposed between the lower electrode 102 and the upper electrode 104, the leak of the vibration energy is large, although the electrostatic capacitance per unit area is reduced. The resonance characteristics are degraded accordingly. In contrast, when the acoustic multilayer 120 is used, the leak of the vibration energy is small, and therefore, the degradation in the resonance characteristics can be effectively reduced.

Materials for the reflective films 121 and 122 are not limited as long as acoustic impedance of the reflective film 121 is higher than that of the reflective film 122. However, it is preferable that the same material as that of the reflective film constituting the acoustic multilayer 110 is used. Specifically, of the reflective films 121 and 122 making up a pair, it is preferable that aluminum nitride (AlN) is used for the reflective film 121 placed on the upper electrode 104 side, and silicon oxide (SiO$_2$) is used for the reflective film 121 placed on the piezoelectric film 103 side. If aluminum nitride (AlN) is used as the material for the reflective film 121, the reflective film 121 is preferably formed by sputtering. If silicon oxide (SiO$_2$) is used as the material for the reflective film 122, the reflective film 122 is preferably formed by CVD. The thicknesses of the reflective films 121 and 122 may be set in accordance with the desired resonant frequency, and each thickness is preferably set at approximately quarter of the wavelength.

The upper electrode 104 is used as the other electrode of the film bulk acoustic resonator, and the material therefor is not particularly limited as long as the material has high conductivity. The upper electrode 104 can be formed of a metal such as aluminum (Al), gold (Au) or platinum (Pt), an alloy of these metals and copper (Cu) or the like, or a multilayer film obtained by stacking layers of these metals and titanium (Ti) or the like. The thickness of the upper electrode 104 may be set in accordance with the desired resonant frequency, and preferably set at approximately one-tenth of the wavelength. Vacuum deposition, sputtering or CVD can be used to form the upper electrode 104.

Described hereinbefore is the structure of the film bulk acoustic resonator of this embodiment. In this way, in the film bulk acoustic resonator of this embodiment, the acoustic multilayer 120 is interposed between the piezoelectric film 103 and the upper electrode 104. Therefore, the distance between the lower electrode 102 and the upper electrode 104 is extended by the thickness of the acoustic multilayer 120, whereby the electrostatic capacitance between the lower electrode 102 and the upper electrode 104 per unit area can be reduced. Thus, the overlap between the upper and lower electrodes (electrode area) can be made larger than that in a case where there is no acoustic multilayer 120. It is therefore not required to set the electrode area to be extremely small (in particular, 5000 $\mu$m$^2$ or less) even when the resonant frequency is set to be as high as, for example, 5 GHz or more. The influence of the grains of the piezoelectric material is reduced accordingly, whereby the degradation in the resonance characteristics can be reduced.

Described with concrete numerical values, when ZnO ($\epsilon$r=9.03) is used as the material for the piezoelectric film 103 and the resonant frequency is set at 5 GHz, a required film thickness is 0.27 $\mu$m. Here, if required electrostatic capacitance is 0.626 pF, for example, and if the acoustic multilayer 120 does not exist, the electrode area needs to be set at 46 $\mu$m square (2116 $\mu$m$^2$). In contrast, when the acoustic multilayer 120 including the reflective film 121 of AlN ($\epsilon$r=12) with a thickness of 0.51 $\mu$m and the reflective film 122 of SiO$_2$ ($\epsilon$r=4.29) with a thickness of 0.27 $\mu$m is interposed between the piezoelectric film 103 and the upper electrode 104, the electrode area required to obtain the same electrostatic capacitance (0.626 pF) is 98.5 $\mu$m square (9702.25 $\mu$m$^2$). Thus, the electrode area that is approximately 4.6 times larger can be secured.

Moreover, the acoustic multilayer 120 also serves to improve a temperature coefficient of frequency (TCF). In the film bulk acoustic resonator of this embodiment, a temperature coefficient of frequency of approximately −17 ppm/° C. can be obtained. In contrast, if the acoustic multilayer 120 is removed from the film bulk acoustic resonator of this embodiment, the temperature coefficient of frequency becomes approximately −40 ppm/° C.

Figure 2:
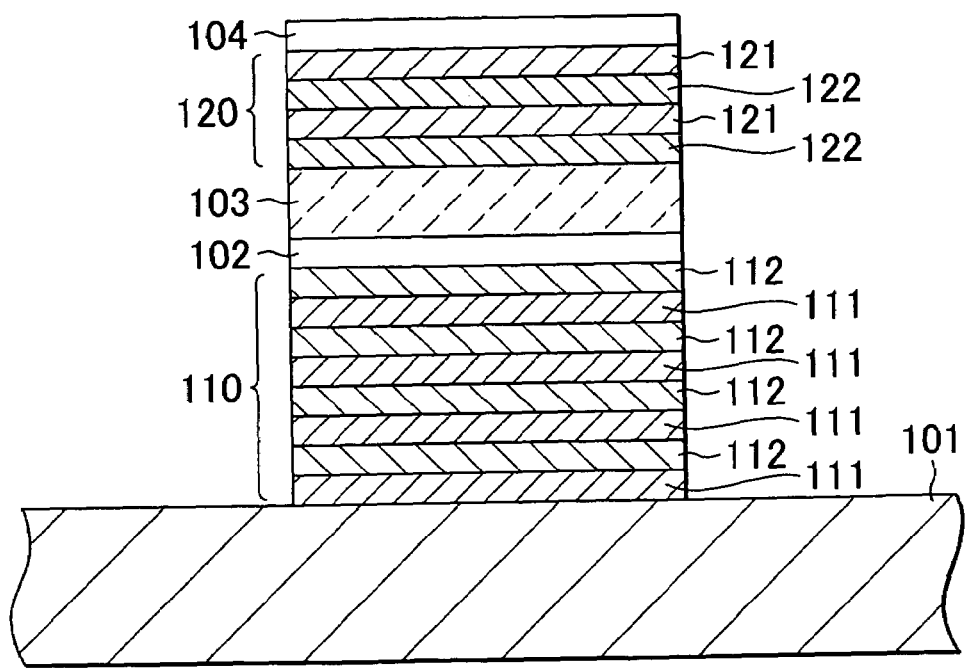
FIG. 2 is a modified example of the film bulk acoustic resonator shown in FIG. 1.

Note that the number of the reflective film pair (a pair made up of the reflective films 121 and 122) constituting the acoustic multilayer 120 does not need to be one, and a plurality of pairs as shown in FIG. 2 (two pairs in FIG. 2) can be provided in accordance with required characteristics.

Figure 3:
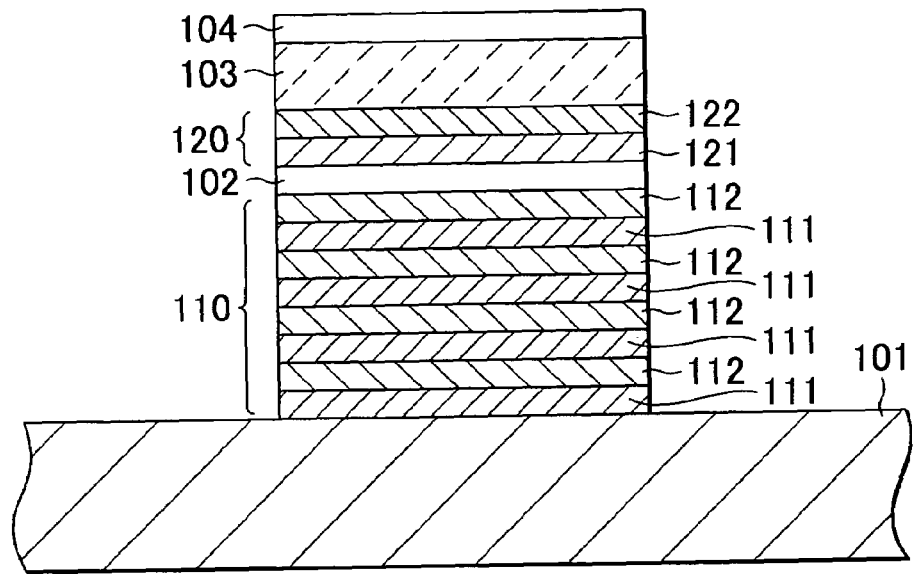
FIG. 3 is a schematic sectional view showing a structure of a film bulk acoustic resonator according to another preferred embodiment of the present invention.

FIG. 3 is a schematic sectional view showing a structure of a film bulk acoustic resonator according to another preferred embodiment of the present invention.

Figure 4:
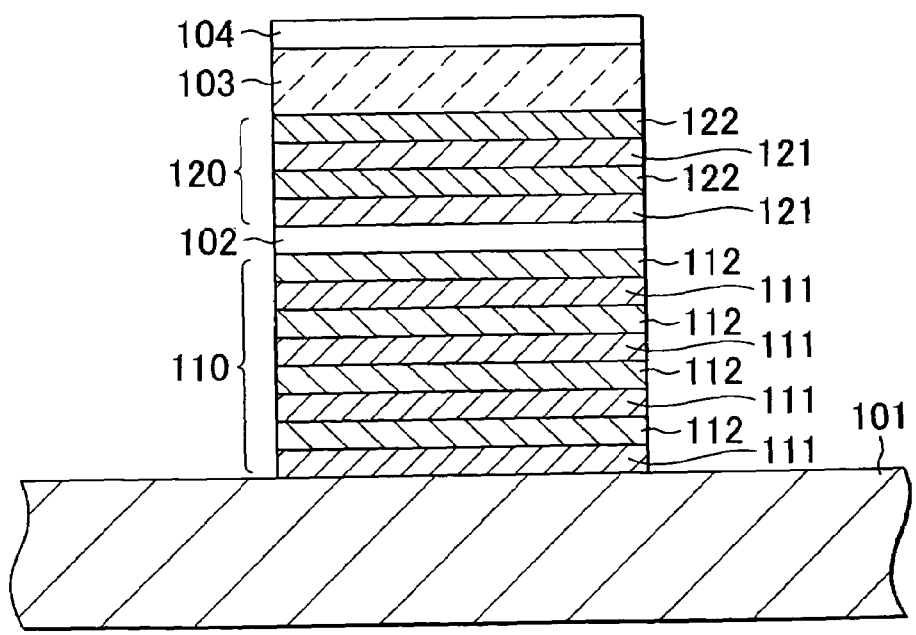
FIG. 4 is modified example of the film bulk acoustic resonator shown in FIG. 3.

As shown in FIG. 3, the film bulk acoustic resonator of this embodiment is different from the film bulk acoustic resonator shown in FIG. 1 in that the acoustic multilayer 120 is interposed between the lower electrode 102 and the piezoelectric film 103. Other aspects are the same as those of the film bulk acoustic resonator shown in FIG. 1, and the same effect can be obtained. However, when the acoustic multilayer 120 is interposed between the lower electrode 102 and the piezoelectric film 103, positions of the reflective film 121 (for example, AlN) and reflective film 122 (for example, SiO$_2$) in FIG. 1 need to be reversed, as shown in FIG. 3. That is, the reflective film 122 (for example, SiO$_2$) needs to be disposed on the piezoelectric film 103 side. Note that, also in this embodiment, the number of the reflective film pair (a pair made up of the reflective films 121 and 122) constituting the acoustic multilayer 120 does not need to be one, and a plurality of pairs as shown in FIG. 4 (two pairs in FIG. 4) can be provided in accordance with required characteristics.

FIG. 5 is a schematic sectional view showing a structure of a film bulk acoustic resonator according to still another preferred embodiment of the present invention.

As shown in FIG. 5, the film bulk acoustic resonator of this embodiment is different from the film bulk acoustic resonator shown in FIG. 1 in that the acoustic multilayer 120 is interposed not only between the piezoelectric film 103 and the upper electrode 104 but also between the lower electrode 102 and the piezoelectric film 103. Other aspects are the same as those of the film bulk acoustic resonator shown in FIG. 1, and the same effect can be obtained. As for the acoustic multilayer 120 interposed between the lower electrode 102 and the piezoelectric 103, the reflective film 121 (for example, AlN) and the reflective film 122 (for example, $SiO_2$) thereof need to be positioned in a reversed manner with respect to those of the acoustic multilayer 120 between the piezoelectric film 103 and the upper electrode 104, as in the another preferred embodiment. Note that, also in this embodiment, the number of the reflective film pair (a pair made up of the reflective films 121 and 122) constituting each acoustic multilayer 120 does not need to be one, and a plurality of pairs can be provided in accordance with required characteristics. Moreover, the number of the reflective film pair constituting the acoustic multilayer 120 interposed on the upper electrode 104 side and the number of the reflective film pair constituting the acoustic multilayer 120 disposed on the lower electrode 102 side may be different from each other.

The present invention has thus been shown and described with reference to specific embodiments. However, it should be noted that the present invention is in no way limited to the details of the described arrangements but changes and modifications may be made without departing from the scope of the appended claims.

For example, in the present invention, the planer shape of the film bulk acoustic resonator is not particularly limited, and it may be any shape including a quadrangle such as a square or a rectangle, a triangle, a polygon, an inequilateral polygon, a circle, an ellipse and the like.

What is claimed is:

1. A film bulk acoustic resonator, comprising:
   an upper electrode;
   a lower electrode; and
   a piezoelectric film and at least one of an acoustic multilayer that are provided between the upper electrode and the lower electrode.

2. The film bulk acoustic resonator as claimed in claim 1, wherein the acoustic multilayer includes at least one pair made up of a first reflective film and a second reflective film composed of a material different from that of the first reflective film.

3. The film bulk acoustic resonator as claimed in claim 2, wherein a main component of the first reflective film is aluminum nitride (AlN), and a main component of the second reflective film is silicon oxide ($SiO_2$).

4. The film bulk acoustic resonator as claimed in claim 3, wherein the second reflective film is located at a piezoelectric film side in view of the first reflective film.

5. The film bulk acoustic resonator as claimed in claim 1, wherein the acoustic multilayer is interposed between the piezoelectric film and the upper electrode.

6. The film bulk acoustic resonator as claimed in claim 1, wherein the acoustic multilayer is interposed between the piezoelectric film and the lower electrode.

7. The film bulk acoustic resonator as claimed in claim 1, wherein the at least one of the acoustic multilayer includes a first acoustic multilayer and a second acoustic multilayer, the first acoustic multilayer being interposed between the piezoelectric film and the upper electrode, and the second acoustic multilayer being interposed between the piezoelectric film and the lower electrode.

8. The film bulk acoustic resonator as claimed in claim 1, further comprising another acoustic multilayer provided between the lower electrode and a substrate.

9. The film bulk acoustic resonator as claimed in claim 2, further comprising another acoustic multilayer provided between the lower electrode and a substrate.

10. The film bulk acoustic resonator as claimed in claim 3, further comprising another acoustic multilayer provided between the lower electrode and a substrate.

11. The film bulk acoustic resonator as claimed in claim 4, further comprising another acoustic multilayer provided between the lower electrode and a substrate.

12. The film bulk acoustic resonator as claimed in claim 5, further comprising another acoustic multilayer provided between the lower electrode and a substrate.

13. The film bulk acoustic resonator as claimed in claim 1, wherein a main component of the piezoelectric film is zinc oxide (ZnO).

14. The film bulk acoustic resonator as claimed in claim 1, wherein a resonant frequency of the film bulk acoustic resonator is 5 GHz or more.

* * * * *